US008746086B1

(12) United States Patent
Niemeyer

(10) Patent No.: US 8,746,086 B1
(45) Date of Patent: Jun. 10, 2014

(54) EXTREMELY LOW POWER PRESSURE SENSING SYSTEM USING POWER STROBED SENSOR

(71) Applicant: Thaddeus J. Niemeyer, Conroe, TX (US)

(72) Inventor: Thaddeus J. Niemeyer, Conroe, TX (US)

( * ) Notice: Subject to any disclaimer, the term of this patent is extended or adjusted under 35 U.S.C. 154(b) by 62 days.

(21) Appl. No.: 13/707,934

(22) Filed: Dec. 7, 2012

(51) Int. Cl.
*G01L 1/00* (2006.01)

(52) U.S. Cl.
USPC .......................................... 73/862.68; 73/862

(58) Field of Classification Search
USPC ...................................................... 73/862.68
See application file for complete search history.

(56) References Cited

U.S. PATENT DOCUMENTS

| 4,187,418 A | 2/1980 | Harris |
| 5,767,465 A | 6/1998 | Fulton et al. |
| 6,195,021 B1 | 2/2001 | Keaveney |
| 6,340,936 B1 * | 1/2002 | McGaffey et al. ............. 340/944 |
| 6,466,140 B1 * | 10/2002 | McGaffey et al. ............. 340/944 |
| 6,980,126 B2 * | 12/2005 | Fournier ........................ 340/925 |
| 6,982,630 B2 * | 1/2006 | Beckwith et al. ........... 340/407.1 |
| 7,145,476 B2 * | 12/2006 | Beckwith et al. ............. 340/944 |
| 7,253,720 B2 | 8/2007 | Beckwith et al. |
| 7,358,654 B2 * | 4/2008 | Aromin ......................... 310/348 |
| 7,601,928 B1 * | 10/2009 | Magness et al. .............. 200/345 |

* cited by examiner

*Primary Examiner* — Lisa Caputo
*Assistant Examiner* — Jamel Williams
(74) *Attorney, Agent, or Firm* — Egbert Law Offices, PLLC

(57) ABSTRACT

A sensing system has a sensor suitable for producing a signal relative to the sensing of a physical parameter, a power supply connected to the sensor, and a strobe interconnected to the sensor or to the power supply so as to pass power to the sensor so as to activate the sensor so as to cause the sensor to sense the physical parameter. The strobe intermitantly passes power at rapid rate to the sensor. A human interface device is cooperative with the sensor such that the sensor senses an operation of the human interface device. The sensor is a piezoresistive sensor. A processor is connected to the sensor so as to receive a signal from the sensor corresponding to the activation of the sensor by the strobe.

18 Claims, 3 Drawing Sheets

EXTREMELY LOW POWER PRESSURE SENSING SYSTEM USING POWER STROBED SENSOR

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present invention relates to the operation of sensors. More particularly, the present invention the relates to the use of sensors for sensing physical parameters. Additionally, the present invention relates to the rapidly switching or strobing of the power to the sensor so as to intermittently activate the sensor for the sensing of a physical parameter.

2. Description of Related Art Including Information Disclosed Under 37 CFR 1.97 and 37 CFR 1.98.

Electrical remote sensing is frequently accomplished by placing an electrical potential (voltage) across wires connected to a remote sensing device. The supervisory controller usually senses remote activity by monitoring the power consumption across these lines. When such remote sensing involves a human interface, severe limitations are placed upon power transmission capability across the wires to reduce the potential for electrical shock. This means limiting the voltage, the current, or both. Sensing occurs when the remote device causes power flow across the line to exceed a "threshold". This threshold, in the case of human interface devices is very small. Remote sensors may be entirely passive (consuming no quiescent power) or active devices whose quiescent power consumption is extremely low (below the sensing "threshold"). A pedestrian pushbutton for traffic control is an example of such a device.

Totally passive devices, such as ordinary normally open contact switches have been in use for years. However, environmental, mechanical and other demands have led to the demands of development of pressure-sensitive devices. Such devices operate by using passive sensors (which do not consume power in order to operate) with a limited number of active components to monitor the passive sensor. In many cases, however, passive sensors have sensing limitations that could be overcome through the use of an active sensor if a method could be found to satisfy the extremely low power requirements.

One type of passive sensor is a piezoelectric sensor. Piezoelectricity is the charge that accumulates in certain solid materials in response to applied mechanical stress. As a result, electricity can be produced from pressure. Piezoelectric material produce a voltage when strained.

It has been known for many pushbutton systems to utilize force-sensitive piezoelectric elements which produce a voltage pulse upon being acted upon by a mechanical pressure. The use of piezoelectric crystal or other materials are especially useful in the construction of electronic switches requiring little or no actuating movement or travel. Because such pushbuttons have little or no contacting parts, such assemblies are useful for a high number of operation cycles with little or no wear.

The piezoresistive effect describes the change in electrical resistance (in the case of mechanical devices) or resistivity (in the case of semiconductor devices) when a mechanical stress is applied. In contrast to the piezoelectric effect, the piezoresistive effect only causes a change in electrical resistance, not in electrical potential. The piezoresistive effect has been used for sensor devices employing many types of mechanical and semiconductor devices. This has enabled a wide range of products that use the piezoresistive effect. Many commercial devices, such as pressure sensors and acceleration sensors, employ the piezoresistive effect.

Since piezoresistive devices require the application of power, it becomes very difficult to utilize such piezoresistive sensors under those circumstances where very low power is required. Typical piezoresistive devices consume several milliamperes of current. This is unacceptable in extremely low power applications. Fundamentally, the advantage of piezoelectric sensors over piezoresistive sensors in association with human interfaces is the zero quiescent power consumption of the piezoelectric device. For example, in pedestrian pushbuttons, quiescent current consumption is very rigidly limited to a few hundred microamps. This seemingly eliminates the typical piezoresistive load cell which consumes milliamps rather than microamps. Thus, a typical one kiloohm load cell will consume five milliamps when powered with five VDC. This is more than ten times the absolute maximum allowable quiescent current and more than one hundred times that of the piezoelectric device. Additionally, this would not include the power consumption of the circuitry needed to service the load cell. As such, a need has developed so as to cause the average current consumption to be greatly reduced.

The development of such sensors is particularly important for use in association with pedestrian pushbuttons. Piezoelectric sensors are commonly used in high-traffic areas to control traffic lights for pedestrians crossing the roadways. These buttons typically are placed about chest high on the pole supporting the light or other traffic device being controlled. Because of their position on the pole, the pushbutton is a common target for vandals and mischievous youngsters. In addition, the button is continuously exposed to the elements, making the electrical components contained in the button housing susceptible to damage from salt spray, especially in coastal areas and tropical climates. Thus, there is need for a pushbutton that is less inviting to vandals and more resistant to the elements while, at the same time, having extremely low power consumption.

In the past, various patents have issued relating to such pushbutton assemblies. For example, U.S. Pat. No. 4,187,418, issued on Feb. 5, 1980 to R. C. Harris, teaches a combination pedestrian sign and pushbutton for the control of traffic lights. A saddle is formed with a semi-cylindrical, longitudinally extending, concave rear face conforming to the contour of a cylindrical post to which the unit is normally mounted and a front face formed with raised letters presenting pedestrian information. The upper and lower ends of the saddle are formed with arcuate grooves on the front face thereof for engagement by metal banding straps employed to secure the saddle to an appropriate post. A manually-operated pushbutton switch for pedestrians is mounted to the lower front face of the saddle for connection with traffic signal control circuits.

U.S. Pat. No. 5,767,465, issued on Jun. 16, 1998 to Fulton et al., provides a pedestrian crosswalk switch for registering a force applied to a crosswalk button. The switch includes a button housing, a crosswalk button assembly including a compression spring, a button coupling assembly, and a microswitch assembly. The crosswalk button assembly has a button shank that protrudes through the compression spring and into a button aperture of the button housing. The microswitch assembly has a movable trigger and a compression spring pivotally mounted to a microswitch by a pivot pin. Depression of the crosswalk button forcibly moves the button coupling assembly into engaging contact with the trigger so as to create an input for the microswitch. This notifies the traffic control apparatus that a change in the crosswalk signal is requested.

U.S. Pat. No. 6,466,140, issued on Oct. 15, 2002 to McGaffey et al., shows a pedestrian pushbutton assembly for activating a signal generator to generate a signal at a street crosswalk. The pedestrian pushbutton assembly has a rigid frame having a piezoelectric material of a solid state switch positioned across a central aperture, and an elastic sealing ring positioned in a groove surrounding the piezoelectric material. A button is secured to the rigid frame such that a seal contact portion of the button sealably rests against the elastic sealing ring. A very small space separates an abutment surface of the button and a stopper surface of the rigid frame. The elastic pressure portion of the button contacts the piezoelectric material. When operated, the elastic sealing ring is sufficiently biased to urge the elastic pressure portion against the piezoelectric material to generate a signal pulse.

U.S. Pat. No. 6,195,021, issued on Feb. 27, 2001 to B. Keaveney, describes a smart pedestrian pushbutton actuator for a signalized intersection. This system actuates pedestrian timing intervals using a normally closed circuit rather than a normally open circuit. The open circuit results from the common faults of devices such that systems will result in the recognition of the failure.

U.S. Pat. No. 6,340,936, issued on Jan. 22, 2002 to McGaffey et al., provides an accessible pedestrian signal system to assist visually-impaired persons to cross a signal-controlled intersection. The signal system has a pushbutton which is pressed by the pedestrian. Circuitry is provided to vibrate the pushbutton when the signal system is programmed to send a signal that is timed so as to allow a pedestrian to cross the intersection. The pushbutton is mounted on a flexible diaphragm and a vibrating movement is transmitted to the inner surface of the diaphragm when it is desired to vibrate the pushbutton. The pressing of the button flexes a piezoelectric member which has an output to the circuitry of the signal system.

U.S. Pat. No. 6,980,126, issued on Dec. 27, 2005 to S. Fournier, teaches a photocell pedestrian button which has a casing adapted to be mounted to a traffic light post. The casing has a bottom face that carries a window. A photocell is mounted in the casing for directing a beam through the window in a downward direction generally parallel to the post to which the casing is mounted. The photocell is responsive to the presence of a pedestrian's hand placed beneath the window in the beam. The photocell is adapted to be operatively connected to the traffic light controller to send a signal thereto when the presence of a pedestrian has been detected.

U.S. Pat. No. 7,253,720, issued on Aug. 7, 2007 to Beckwith et al., provides a programmable pushbutton having a microcontroller located therewithin to provide a switching signal to operate an electronic switch and thereby enable power to be supplied from a source of power to a load to initiate an external event. The pushbutton has a piezoelectric assembly which is responsive to one or a sequence of manually-applied pushing forces at a pushbutton cap. The microcontroller is interconnected with the piezoelectric assembly on a printed circuit board so that the output voltage signals generated by the piezoelectric assembly are applied to the microcontroller as a series of digital pulses. The microcontroller can be programmed by applying a particular sequence of pushing forces to the pushbutton cap so that one or more times can be set during which the external event will be initiated or to require a predetermined security code to be entered before the external event can be initiated.

U.S. Pat. No. 7,601,928, issued on Oct. 13, 2009 to Magness et al., shows a pedestrian pushbutton that discourages vandals and resists weather-related damage. The plunger is contained in a sleek, solid housing formed by a cup-shaped front cover that overlaps and substantially encloses a shallower, cup-shaped body, in order to protect the electrical components inside. The body is attachable from the inside to the traffic pole or other support surface. The cover engages the body by means of a "twist-lock" connection that is hidden from view in the installed device.

It is an object of the present invention to provide a sensor system that has extremely low power requirements.

It is another object of the present invention to provide a sensor system that can be utilized in association with pedestrian pushbuttons.

It is a another object of the present invention to provide a sensor system that is adjustable to the desired pressure on the pushbuttons.

It is a further object of the present invention to provide a sensor system that utilizes an adjustable strobing system for the activation of the sensor.

These and other objects and advantages of the present invention will become apparent from a reading of the attached specification and appended claims.

BRIEF SUMMARY OF THE INVENTION

The present invention is an extremely low power sensor system that comprises a sensor suitable for producing a signal in relation to a sensing of a physical parameter, a power supply connected to the sensor, and a strobing means interconnected to the sensor or the power supply. The strobing means serves to pass power to the sensor so as to activate the sensor so as to cause the sensor to sense the physical parameter. The strobing means serves to intermittently pass power to the sensor.

A human interface device can be cooperative with the sensor such that the sensor senses an operation of the human interface device. In the preferred embodiment of the present invention, the human interface device is a pedestrian pushbutton. The sensor is a piezoresistive sensor. A processor can be connected to the sensor so as to receive a signal from the sensor corresponding to the activation of the sensor by the strobing means. The processor produces outputs to a control device. The processor is cooperative with strobing means. The sensor is a piezoresistive typically containing strain gauges of mechanical of semiconductor devices employed singularly or in arrays (such as in typical load cells).

Where a human interface device is used, the processor is connected to the sensor so as to receive a signal from the sensor relative to the operation of the pedestrian pushbutton. The indicator is connected to the processor so as to produce an electrical signal corresponding to the signal from the sensor. In addition to an electrical signal, a human perceivable signal (i.e. audio or visual signals) can also be produced. The preferred embodiment of the present invention includes a unique construction of the pedestrian pushbutton. In particular, the pedestrian pushbutton includes a housing having an interior area and a button translatably positioned in this interior area. The sensor is cooperative with the button so as to sense a movement of the button relative to the housing. A plate is positioned in the housing. The sensor is positioned in the housing. The sensor is positioned adjacent to the plate within the housing. The button has a surface bearing on the sensor when the button moves toward the plate.

The interior area has a wall extending therearound. An environmental seal is interposed between a side of the button and the wall of the interior area. The plate has a flange extending radially outwardly therefrom. This flange faces the plate. A flexible seal is interposed between the flange and the plate. The flange can include a pointed member extending downwardly therefrom. This pointed member has a sharp end bearing against the flexible seal. A threaded member is adjustably positioned within the button. The threaded member has an end bearing against the sensor.

Ultimately, in the present invention, the strobing means serves to pass power to the sensor. The power supply is intended to supply less than 500 microamps of average current consumption to the sensor.

This foregoing section is intended to describe, with particularity, the preferred embodiments of the present invention. It is understood that changes to these preferred embodiments can be made within the concept of the present invention. As such, this section is not to be construed, in any way, the limiting of the broad scope of the present invention. The present invention should only be limited by the following claims and their legal equivalents.

BRIEF DESCRIPTION OF THE SEVERAL
VIEWS OF THE DRAWINGS

DETAILED DESCRIPTION OF THE INVENTION

Figure 1:
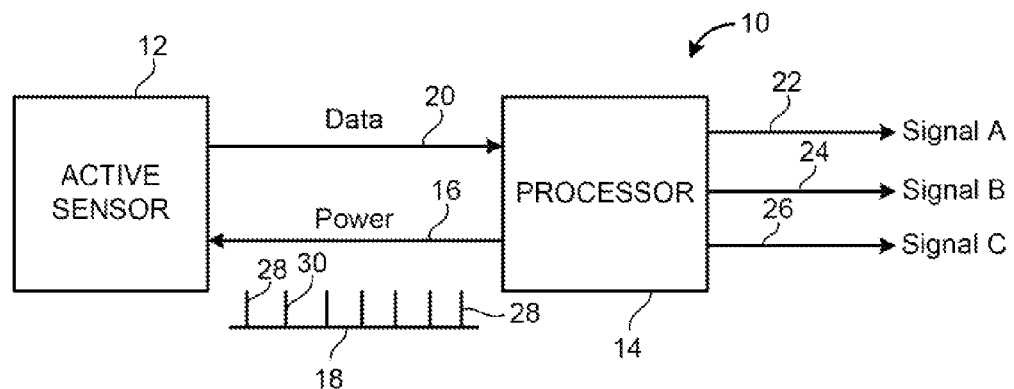
FIG. 1 is a block diagram showing the sensor system of the present invention.

Referring to FIG. 1, there is shown the sensor system 10 in accordance with the preferred embodiment of the present invention. The sensor system 10 includes a sensor 12 that is suitable for producing a signal relative to the sensing of a physical parameter. A processor 14 is cooperative with the active sensor. Ultimately, power is delivered from the processor (from a power supply) to the active sensor 12. As can be seen in FIG. 1, the power supply 16 is strobed by the processor 14. The data 20 as sensed by the active sensor 12 is then delivered to the processor 14. Ultimately, the processor 14 can transmit control signals 22, 24 and 26 outwardly therefrom.

The active sensor 12 can be utilized in association with a human interface device, such as a pedestrian pushbutton. The sensor 12 is a piezoresistive sensor. In order for the piezoresistive sensor to operate properly, power 16 must be supplied to the sensor 12. The change of resistance or resistivity of the active sensor 12 will ultimately cause the data 20 to be delivered to the processor.

In order to minimize the power requirements of the active sensor 12, the processor 14 can suitably strobe the power 16 in the form indicated at 18. In other words, the processor 14 can integrate a switch therein so as to rapidly strobe the power passed therefrom. Alternatively, the processor 14 can be suitably connected to a switch that is rapidly turned on and off so that power is strobed toward the active sensor 12. Each time the active sensor 12 receives a spike 28 of power, the sensor 12 is activated so as to sense a physical parameter. At that time, the sensing of the physical parameter will pass from the active sensor 12 as data 20 for the processor 14. The "data" can be analog or digital information content signals produced by or received by various components. The active sensor 12 will immediately turn off for the period of time between spikes 28 and 30. As such, the power requirements at that time are zero. When the spike 30 of power is delivered to the active sensor 12, the active sensor 12 is actuated to again sense the physical parameter.

As an example, if the active sensor 12 is associated with the pedestrian pushbutton, the actuation of the active sensor 12 by the spike 28 of power 16 would indicate that no force has been applied to the pedestrian pushbutton. As such, the data 20 would pass to the processor 14 to indicate that no person is at the pedestrian pushbutton or that there is no desire to activate the traffic control light. As such, the processor 14 will not pass any of the signals 22, 24 and 26.

On the other hand, when the spike 30 of the power 16 is delivered to the active sensor 12, the active sensor 12, when actuated at that time, could indicate that a force has been applied to pedestrian pushbutton. This force would be passed as data 20 to the processor 14. The processor 14 will interpret this data in order to transmit signals 22, 24 and 26. Signal 22, as a example, could be a signal to activate the traffic control lights and/or activate a light associated with the pedestrian pushbutton. As such, a visual signal could be provided to the operator of the pedestrian pushbutton that the pressing of the pedestrian pushbutton has occurred and that the traffic control light is being operated. The signal 24 for example could pass as Signal B for the operation of a audio alert device. The sound generator could be placed on or adjacent to the pedestrian pushbutton. This would provide an audio signal to the operator that the button has been depressed and that the traffic control light will be operated, as desired. The signal 26 could be passed as signal C to a remote "supervisory controller" so as to monitor the power and, optionally, the local human feedback signals of sound and/or light.

Ultimately, the power 16 can be strobed by the processor 14 at a very rapid rate. As such, there would be no possibility that pressure would be applied to the pushbutton without detection. This rapid rate cycling is carried out while, at the same time, continuing to minimize the quiescent power requirements. Ultimately, the average quiescent current of requirements of the sensor 12 is less than five hundred microamps. In particular, the "duty cycle" of sensor 12 ultimately reduces the average power consumption of the sensor. For example, a five milliamp sensor running at a 1% duty cycle reduces the average current consumption to 50 microamps. Ultimately, the active sensor 12 may only be receive power for only about one percent of the time. As such, although the spike 28 of power delivered by the strobing effect are sufficient to power the sensor 12, the minimal amount of time that the sensor is on relative to the amount of time that the sensor is off, will ultimately minimize the power requirements. It is believed that this present invention would bring the average current requirements for the piezoresistive sensor associated with the active sensor 12 of the pedestrian pushbutton to approximately one hundred microamps.

Figure 2:
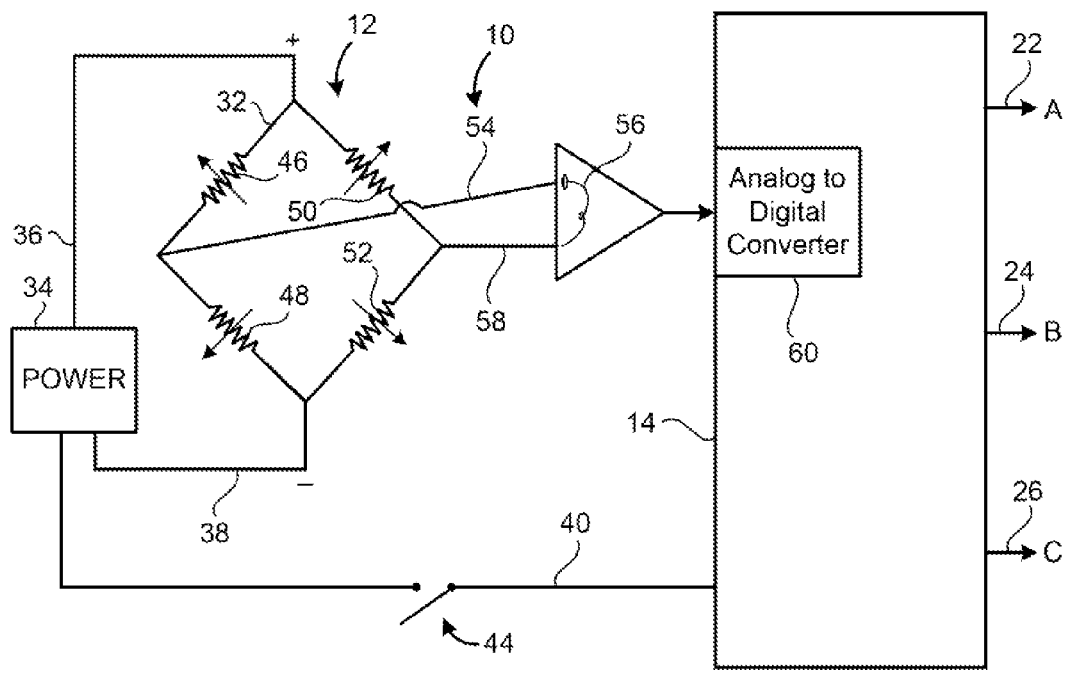
FIG. 2 is an electrical schematic showing the sensor system of the present invention.

FIG. 2 is an electrical schematic of the sensor system 10 of the present invention. In FIG. 2, the sensor 12 is illustrated in the form of a Wheatstone bridge 32. The power supply 34 is connected by lines 36 and 38 to the Wheatstone bridge 32. A line 40 extends from the processor 14 to the power supply 34. A switch 44 is illustrated as located on line 40. Ultimately, the processor 14 can operate so as to rapidly open and close the switch 44 so as to achieve the strobing effect of the present invention. When the switch 44 is open, no power is delivered to the Wheatstone bridge 32. On the other hand, when the switch 44 is closed, power will be passed to the Wheatstone bridge 32 such that the sensor 12 is activated.

The Wheatstone bridge 32 includes variable resistors 46, 48, 50 and 52. The two opposite vertices are connected by lines 36 and 38 to the power supply 34. The variation in resistance develops a voltage difference between sensed voltage 54 and reference voltage 58. This voltage difference is monitored by differencing amplifier 56. The differencing amplifier 56 can include an op-amp so as to increase the voltage passing to the processor 14, as desired.

For example, if pressure is applied to the pedestrian pushbutton, then the differencing amplifier circuit 56 will compare the sensed voltage versus reference voltage produced by the Wheatstone bridge 32 so as to go high. The reference voltage or value is the quiescent voltage, value or signal produced by a sensor in its unexcited state. This will transmit signals to the processor, by way of analog-to-digital converter 60, that the pushbutton has been pressed. As a result, the signals 22, 24 and 26 can be transmitted from the processor 14. On the other hand, if the sensed voltage along line 54 and the referenced voltage along line 58 are identical (or within accepted tolerances), then the differencing amplifier circuit 56 will transmit signals that the pedestrian pushbutton has not been pressed. As such, the signal 22, 24 and 26 will not be passed.

It should be noted that, within the concept of the present invention, various modifications can be made to the electrical schematic. For example, other circuit configurations, other than a Wheatstone bridge, can be utilized for analyzing whether the sensor 12 senses a physical parameter. The switch 44 can be cooperative with the processor 14 or integrated therein. The sensor 12 can be a load cell. The load cell is a transducer that is used to convert a force into an electrical signal. This conversion is indirect and happens in two stages. Through a mechanical arrangement, the force being sensed deforms a strain gauge. The strain gauge measures the deformation (strain) as an electrical signal, because the strain changes the effective electrical resistance. A load cell usually consists of four strain gauges in the Wheatstone bridge configuration. Load cells of one strain gauge (quarter bridge) or two strain gauges (half bridge) are also available. Electrical signal output is typically in the order of a few millivolts and requires amplification by an instrumentation amplifier before it can be used. The output of the transducer is plugged into an algorithm to calculate the force applied to the transducer. In the present case, the load cell is associated with a piezoresistive transducer.

The sensor 12 can also be in the nature of a strain gauge. The strain gauge takes advantage of the physical property of electrical conductance and its dependence on the conductor's geometry. The length and cross-section will change when an electrical conductor is stressed within the limits of its elasticity such that it does not break or is permanently deformed. These changes increase its electrical resistance end-to-end. Conversely, when a conductor is compressed such that it does not buckle, it will broaden and shorten. These changes decrease the electrical resistance end-to-end. The amount of applied stress or pressure applied to the pedestrian pushbutton can be inferred from the mechanical electrical resistance of the strain gauge.

Figure 3:
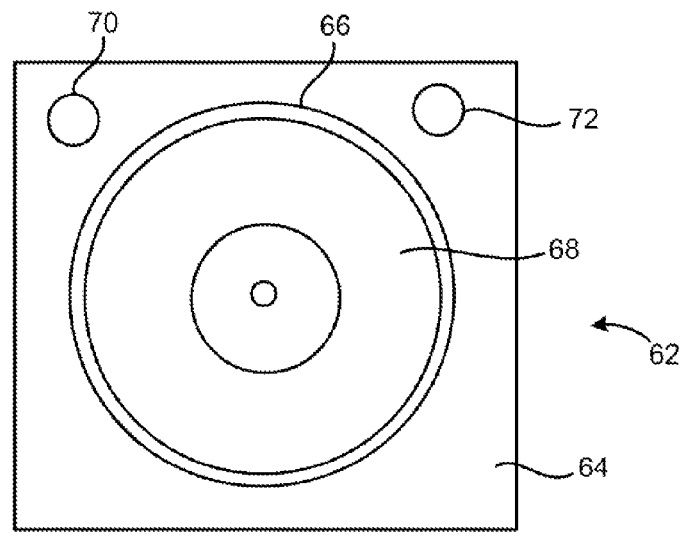
FIG. 3 is a frontal view of the pedestrian pushbutton associated with the sensor system of the present invention.

The sensor system of the present invention is particularly adapted for use in association with a pedestrian pushbutton. A frontal view of the pedestrian pushbutton 62 is illustrated in FIG. 3. The pedestrian pushbutton 62 includes a housing 64 having an interior area 66. The pushbutton 68 is received within this interior area 66. The button 68 has a generally circular configuration and is centrally placed within the housing 64. A light 70 is located on or adjacent to the pushbutton 68. The light 70 will illuminate in the event that the pushbutton 68 is pushed. The light 70 is illuminated by the passing of the signal 22 from the processor 14. An audio alert device 72 is positioned on the housing 64 generally adjacent to the pushbutton 68. The audio alert device 72 will produce an audio signal relative to the passing of a signal 24 from the processor 14.

Figure 4:
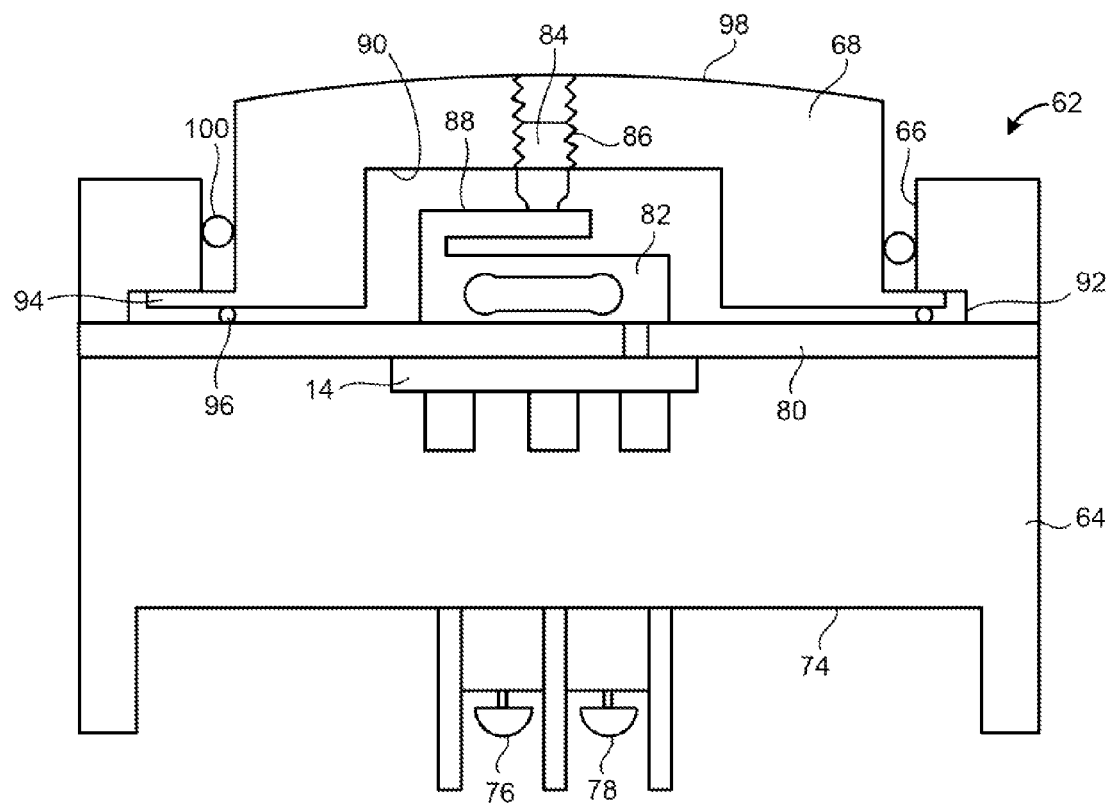
FIG. 4 is a cross-sectional view of the pedestrian pushbutton associated with the sensor system of the present invention.

FIG. 4 is a cross-sectional view of the pedestrian pushbutton 62 in accordance with the preferred embodiment of the present invention. As can be seen, the pushbutton 68 is positioned within the interior area 66 of the housing 64. The housing 64 has a configuration suitable for mounting on a structure associated with a traffic light pole. In particular, there is a channel 74 formed on a back end thereof that allows for the fixing of the housing 64 to an external surface. Suitable electrical connectors 76 and 78 are provided within the channel 74 so as to allow the electrical connection to be established with the components on the interior of the housing 64.

The housing 64 includes a plate 80 that extends generally thereacross. The processor 14 is suitably positioned adjacent to the plate 80. A load cell 82 is positioned adjacent to the plate 80 within the interior of the button 68. The load cell 82 is electrically connected by lines to the processor 14. The button 68 includes a set screw 84 that extends through a threaded area 86 of the button 68. Set screw 84 can be suitably adjusted so as to have an end bearing on a surface 88 of the load cell 82. As such, the pedestrian pushbutton 62 of the present invention can be suitably adjusted so that the desired amount of pressure can be applied to the load cell 82 as the reference force. Various other connections can be established between the button 68 and the surface 88 of the load cell 82. For example, elastomeric members could extend downwardly from the inner surface 90 of the button 68 so as to be in contact with the surface 88. The use of the set screw 84 enhances the adaptability and adjustability of the present invention to the required conditions.

The housing 68 includes a slotted area 92 formed adjacent to the periphery of the button 68. The button 68 has a flange 94 extending radially outwardly therefrom and into the slotted area 92. When the pushbutton 68 is not depressed, the upper surface of the flange 94 will reside against an inner surface of the slotted area 92. A flexible seal 96 is positioned between the bottom surface of the pushbutton 68 and the plate 80. As such, when a force is applied to the outer surface 98 of the pushbutton 68, the flexible seal 96 will compress so as to cause the set screw 84 to bear more strongly against the surface 88 of the strain gauge 82. As such, the strain gauge 82 will sense the supplied pressure and send a signal to the microprocessor 14 in the manner described hereinabove. After the pressure has been removed from the surface 98 of the pushbutton 68, the resilience of the flexible seal 96 will cause the pushbutton 68 to return back to its position such that the flange 94 bears against an upper surface of the slotted area 92. The flexible seal 96 also assures that no liquid materials enter the interior of the pedestrian pushbutton 62.

An elastomeric seal 100 is positioned so as to extend around the exterior side of the pushbutton 68. The elastomeric seal 100 will also bear against an inner wall of the interior area 66 of the housing 64. Elastomeric seal 100 further assures that there will be no liquid intrusion into the interior of the pedestrian pushbutton 62.

Figure 5:
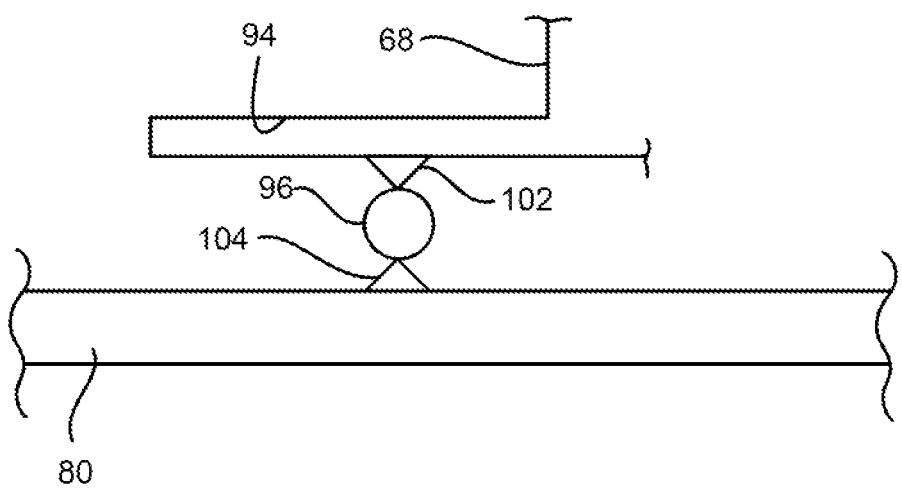
FIG. 5 is a detailed view showing the relationship of the flange of the pushbuttons with respect to a flexible seal positioned adjacent to the plate within the housing of the pedestrian pushbutton of the present invention.

FIG. 5 is a detailed view of a unique aspect of the present invention. As can be seen, the flange 94 of the pushbutton 68 includes a pointed member 102 that bears against the surface of the flexible seal 96. Similarly, if desired, the flexible seal 96 can also rest upon another pointed member 104 extending upwardly from the plate 80. The use of the pointed members 102 and 104 assures a maximum amount of compression that is available onto the flexible seal 96. It also minimizes the point of contact between the pointed members 102 and 104 and the flexible seal 96. This assures a maximum amount of travel that is available between the flange 94 and the plate 80.

The present invention is a circuit technique of power strobing the piezoresistive device so that the average current consumption is greatly reduced. For example, if it were possible to operate the piezoresistive device for only one percent of the time, the average power consumption would be reduced by a factor of one hundred and would be well within the range of pedestrian pushbutton applications. Ultimately, it has been found that, through the use of the present invention, the quiescent average current consumption is less one hundred microamps. The processor 14 allows a great deal of adjustability. For example, the rate at which the spikes of power are delivered to the active sensor could be adjusted ultimately down to five spikes per second while still allowing a great assuredness that the pedestrian pushbutton has been pressed. This would further minimize the power requirements of the system. The present invention can be also adapted so as to sense the desired amount of force that is applied to the pedestrian pushbutton. As such, if it is desired to minimize the force required in order to facilitate the ability of handicapped persons to utilize the pedestrian pushbutton, the processor 14, along with the sensor 12, can be suitably adjusted so as to require minimal pressure to be required for activation.

The foregoing disclosure and description of the invention is illustrative and explanatory thereof. Various changes in the details of the illustrated construction can be made within the scope of the appended claims without departing from the true spirit of the invention. The present invention should only be limited by the following claims and their legal equivalents.

I claim:

1. A sensor system comprising:
   a sensor suitable for producing a signal relative to a sensing of a physical parameter;
   a power supply connected to said sensor;
   a strobing means interconnected to said sensor and said power supply, said strobing means for passing power to said sensor so as to activate said sensor so as to sense the physical parameter, said strobing means for intermitantly passing power to said sensor;
   a human interface device cooperative with said sensor such that said sensor senses an operation of said human interface device.

2. The system of claim 1, said human interface device being a pedestrian pushbutton.

3. The system of claim 1, said sensor being a piezoresistive sensor.

4. The system of claim 1, said sensor being a piezoresistive sensor, said human interface device being a pedestrian pushbutton.

5. The system of claim 1, further comprising:
   a processor connected to said sensor so as to receive a signal from said sensor corresponding to the activation of said sensor by said strobing means.

6. The system of claim 5, further comprising:
   an indicator connected to said processor so as to produce a humanly perceivable signal correspond to a sensing by a sensor of the physical parameter.

7. The system of claim 5, said processor being cooperative with said strobing means.

8. The system of claim 1, said sensor being a load cell.

9. The system of claim 1, said sensor having a strain gauge.

10. The system of claim 2, further comprising:
    a processor connected to said sensor so as to receive a signal from said sensor relative to an operation of said pedestrian pushbutton; and
    an indicator connected to said processor so as to produce an electrical signal corresponding to the signal from said sensor.

11. The system of claim 10, the signal being a light or a sound or both.

12. The system of claim 2, said pedestrian pushbutton comprising:
    a housing having an interior area; and
    a bottom translatably positioned in said interior area, said sensor being cooperative with said button so as to sense a movement of said button relative to said housing.

13. The system of claim 12, further comprising:
    a plate positioned in said housing, said sensor positioned adjacent said plate within said housing, said button having a surface bearing on said sensor when said button moves toward said plate.

14. The system of claim 12, said interior area having a wall extending therearound, the system further comprising:
    an mechanical seal interposed between a side of said button and said wall of said interior area.

15. The system of claim 13, said plate having a flange extending radially outwardly therefrom, said flange facing said plate, the system further comprising:
    a flexible seal interposed between said flange and said plate.

16. The system of claim 15, said flange having a pointed member extending downwardly therefrom, said pointed member having a sharp end bearing against said flexible seal.

17. The system of claim 12, further comprising:
    a threaded member adjustably positioned within said button, said threaded member having an end bearing against said sensor.

18. The system of claim 1, said power supply supplying less than 500 microamps average current to said sensor.

* * * * *